United States Patent
Morishita et al.

(10) Patent No.: US 9,029,766 B2
(45) Date of Patent: May 12, 2015

(54) SCANNING ELECTRON MICROSCOPE

(75) Inventors: Hideo Morishita, Tokyo (JP); Takashi Ohshima, Tokyo (JP); Michio Hatano, Tokyo (JP); Sukehiro Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/241,121

(22) PCT Filed: May 28, 2012

(86) PCT No.: PCT/JP2012/063632
§ 371 (c)(1),
(2), (4) Date: May 27, 2014

(87) PCT Pub. No.: WO2013/035389
PCT Pub. Date: Mar. 14, 2013

(65) Prior Publication Data
US 2014/0361167 A1   Dec. 11, 2014

(30) Foreign Application Priority Data
Sep. 7, 2011   (JP) .................................. 2011-194563

(51) Int. Cl.
*H01J 37/244* (2006.01)
*H01J 37/28* (2006.01)
*H01J 37/04* (2006.01)

(52) U.S. Cl.
CPC ............... *H01J 37/28* (2013.01); *H01J 37/244* (2013.01); *H01J 2237/2443* (2013.01); *H01J 2237/2444* (2013.01); *H01J 2237/24475* (2013.01); *H01J 2237/2448* (2013.01); *H01J 37/04* (2013.01); *H01J 2237/2804* (2013.01); *H01J 2237/2806* (2013.01)

(58) Field of Classification Search
USPC ................................................. 250/310, 306
See application file for complete search history.

(56) References Cited

U.S. PATENT DOCUMENTS

| | | | |
|---|---|---|---|
| 5,424,541 A | 6/1995 | Todokoro et al. | |
| 5,939,720 A | 8/1999 | Todokoro | |
| 6,498,345 B1 | 12/2002 | Weimer et al. | |
| 2002/0185599 A1 | 12/2002 | Kimura et al. | |
| 2003/0230714 A1 | 12/2003 | Yonezawa | |
| 2006/0076489 A1* | 4/2006 | Ohshima et al. | 250/310 |
| 2006/0226360 A1 | 10/2006 | Frosien | |

FOREIGN PATENT DOCUMENTS

| | | |
|---|---|---|
| JP | 05-266855 A | 10/1993 |
| JP | 10-134754 A | 5/1998 |
| JP | 10-294074 A | 11/1998 |
| JP | 2000-030654 A | 1/2000 |
| JP | 2000-299078 A | 10/2000 |
| JP | 2003-172781 A | 6/2003 |
| JP | 2003-331770 A | 11/2003 |
| JP | 2004-047341 A | 2/2004 |
| JP | 2006-278329 A | 10/2006 |
| JP | 2007-059111 A | 3/2007 |
| JP | 2010-212233 A | 9/2010 |

* cited by examiner

*Primary Examiner* — Kiet T Nguyen
(74) *Attorney, Agent, or Firm* — Miles & Stockbridge P.C.

(57) ABSTRACT

To provide a low acceleration scanning electron microscope that can discriminate and detect reflected electrons and secondary electrons even with a low probe current, this scanning electron microscope is provided with an electron gun (29), an aperture (26), a sample table (3), an electron optical system (4-1) for making an electron beam (31) converge on a sample (2), a deflection means (10), a secondary electron detector (8), a reflected electron detector (9), and a cylindrical electron transport means (5) in a position between the electron gun (29) and sample (2). The reflected electron detector (9) is provided within the electron transport means (5) and on a side further away from the electron gun (29) than the secondary electron detector (8) and the deflection means (10). The reception surface (9-1) of the reflected electron detector (9) is electrically wired so as to have the same potential as the electron transport means (5).

14 Claims, 13 Drawing Sheets

SCANNING ELECTRON MICROSCOPE

TECHNICAL FIELD

The present invention relates to a low-acceleration scanning electron microscope.

BACKGROUND ART

There is widely known a scanning electron microscope which obtains a two-dimensional image of a scanning area by two-dimensionally scanning an electron beam probe converged on a specimen, detecting signal electrons generated at an irradiation point, and mapping signals relating to the amount in synchronization with scanning of a primary electron beam.

Signal electrons are generally classified into secondary electrons and backscattered electrons according to their energy. The backscattered electron refers to an electron which enters the specimen, repeats elastic scattering and inelastic scattering, and is consequently emitted from the surface of the specimen. Thus, a backscattered electron has a peak in its yield at the approximately same energy level as that of an incident electron. On the other hand, the secondary electron refers to an electron which is emitted from the surface of the specimen among low-energy electrons generated by the backscattered electrons when they cause the inelastic scattering. Thus, the secondary electron has a peak in its yield at an energy level in the order of a few eV. In general, a signal electron with 50 eV or less energy is referred to as the secondary electron, which is differentiated from the backscattered electron.

A compositional difference is observed as a contrast in a detection image of the backscattered electrons because the yield of the backscattered electrons depends on an average atomic number of the specimen. Furthermore, it is known that a channeling contrast, observed in a specimen having the one and same composition when a crystal orientation is partially different on the surface of the specimen or when a crystal defect is included, also derives from the backscattered electrons. These contrasts need to be detected by separating the backscattered electrons from secondary electrons.

On the other hand, there is recently increasing significance of a low-acceleration observation with an accelerating voltage of about 3 kV or lower for the purpose of an avoidance of damaging and charging of the specimen due to irradiation of a primary electron beam as well as an observation of the top surface of the specimen. Although the scanning electron microscope used at low acceleration employs an observation technique of retarding the primary electron beam immediately before the specimen in order to minimize an aberration exposed in a low-acceleration, when the retardation method is used, it is difficult to detect the secondary electrons and backscattered electrons separately because the secondary electrons are accelerated to the energy level similar to that of the backscattered electrons in consequence of an electric field created around the specimen. However, providing an energy barrier, a Wien filter, or the like on a trajectory of the signal electrons makes it possible to selectively detect the secondary electrons and backscattered electrons. The following Patent Documents 1 to 3 are reported as known means of selectively detect the signal electrons in the low-acceleration region of 3 kV or lower accelerating voltage using a scanning electron microscope.

PRIOR ART DOCUMENT

Patent Document

Patent Document 1: Japanese Patent Laid-open No. 2003-331770
Patent Document 2: Japanese Patent Laid-open No. 2006-278329
Patent Document 3: Japanese Patent Laid-open No. 2000-030654

SUMMARY OF THE INVENTION

Technical Problem

Technological developments have been made to separate and obtain information included in an image in a scanning electron microscope. It is known that secondary electrons and backscattered electrons include different types of information. An image emphasizing information about roughness and potential is obtained by detecting the secondary electrons, and an image emphasizing information about composition and crystal orientation is obtained by detecting the backscattered electrons. Thus, if there is a mechanism capable of detecting the secondary electrons and the backscattered electrons separately by any means, it will be possible to obtain an observation image including different types of information in an identical observation field. However, though a retarding field needs to be applied in order to perform a high-resolution observation at a low accelerating voltage, the secondary electrons are accelerated to the energy level similar to that of the backscattered electrons in the retarding field, and so it is not easy to detect them separately. Therefore, we examined conventional technologies regarding means for separately detecting the secondary electrons or the backscattered electrons using a scanning electron microscope having retarding optics.

Patent Document 1 discloses means for selectively detecting only secondary electrons emitted in a normal direction of the specimen when performing a retarding observation using a scanning electron microscope having an objective lens of a single-pole lens type. With this technique, due to the lens effect in the retarding field and a monopole magnetic field created by applying a retarding voltage of typically about −0.5 kV to a magnetic path on the specimen and a specimen side of the objective lens, the secondary electrons and the backscattered electrons take trajectories closer to an optical axis of electron optics. At this time, the backscattered electrons which are relatively less likely to receive the lens effect than the secondary electrons take trajectories farther away from the optical axis. Thus, by providing a plate having an electron passing hole in the center so as to shield most of the backscattered electrons and deflecting the secondary electrons having passed through the hole without being shielded using the Wien filter, the secondary electrons can be selectively detected without being mixed with the backscattered electrons.

Patent Document 2 and Patent Document 3 disclose means for simultaneously detect the secondary electrons and the backscattered electrons separately. Angles of elevations of electrons emitted from the specimen are defined as below. Assuming the normal direction as 90 degrees and the horizontal direction as 0 degree with respect to the surface of the specimen, the angle ranges are classified as a high angle, a medium angle, and a low angle for convenience. A range near 90-degree angle of elevation is assumed as the high range, near 0-degree angle of elevation as the low angle, and an intermediate range near 45 degrees between the high angle and the low angle as the medium angle.

This technique detects the secondary electrons converged by the lens effect of the retarding field lens and the backscattered electron emitted in the high-angle direction. In the case where the objective lens is of an out-lens type, the magnetic field strength near the specimen is smaller because a principal plane of the lens in the magnetic field is arranged away from the specimen, and therefore the backscattered electrons having high energy hardly receive a convergence effect by the magnetic field. Thus, only the backscattered electrons generated in the high-angle direction closer to the optical axis proceed into a housing cylinder of the scanning electron microscope. On the other hand, the secondary electrons take trajectories farther away from the optical axis after being converged by the effect of the retarding field lens. Thus, by providing a detector having a relatively larger hole in the center through which the backscattered electrons emitted in the high-angle direction can pass, it is possible to detect only the secondary electrons. According to the technique of Patent Document 2, by providing a potential barrier on the trajectory of the backscattered electrons having passed through the detector of the secondary electron and arranging the detector closer to an electron source than the detector of the secondary electrons, it is possible to selectively detect only the backscattered electrons. Moreover, according to the technique of Patent Document 3, by providing a conversion plate on the trajectory of the backscattered electrons having passed through the detector of the secondary electron and detecting conversion electrons generated by impingement of the backscattered electrons using the detector provided off the axis, it is possible to selectively detect only the signal electrons deriving from the backscattered electrons.

However, in the technologies disclosed in the conventional patent documents listed above, the technique of Patent Document 1 is applicable to selective detection of the secondary electrons but not applicable to the selective detection of the backscattered electrons having higher energy in principle. Both techniques of Patent Documents 2 and 3 can detect the backscattered electrons emitted in the high-angle direction separate from the secondary electrons, but are not applicable to the selective detection of the backscattered electrons emitted in a direction of an angle closer to the low angle side. Therefore, they can detect only part of the generated signal electrons, and the yield of the signal electrons itself is low especially with a scanning microscope with a low probe current and low acceleration, which makes it difficult to selectively detect the secondary electrons and the backscattered electrons.

It is an object of the present invention to provide a low-acceleration scanning electron microscope capable of selectively detecting the backscattered electrons and the secondary electrons despite the low probe current.

Solution to Problem

One embodiment to achieve the aforementioned object is a scanning electron microscope including an electron source generating an electron beam to be used as a probe, an aperture limiting a diameter of the electron beam, a specimen holder on which a specimen to be irradiated with the electron beam is placed, an objective lens for converging the electron beam on a surface of the specimen, a deflection means for scanning the electron beam on the specimen to be irradiated with the electron beam, a secondary electron detector detecting the secondary electrons from the specimen, a backscattered electron detector detecting backscattered electrons from the specimen or conversion electrons deriving from the backscattered electrons, and a cylindrical electron transport means in a position between the electron source and the specimen to be placed on the specimen holder, wherein a detector plane of the backscattered electron detector is located inside the electron transport means and on a farther side from the electron source than the secondary electron detector and the deflection means, and the detector plane of the backscattered electron detector is electrically wired to have the same potential as the electron transport means.

Moreover, there is also provided a scanning electron microscope including an electron source, a specimen holder, electron optics including an acceleration tube and an objective lens, accelerating and then retarding electrons emitted from the electron source, and irradiating a specimen placed on the specimen holder with the electrons as an electron beam, a secondary electron detector for detecting secondary electrons from the specimen caused by irradiation of the electron beam, and a backscattered electron detector for detecting backscattered electrons or conversion electrons deriving from the backscattered electrons, wherein the backscattered electron detector has an opening portion in its central portion with its detector plane being located inside the acceleration tube, and the detector plane of the backscattered electron detector is electrically wired to have the same potential as the acceleration tube.

Advantageous Effect of Invention

According to the present invention, a scanning electron microscope capable of selectively detecting backscattered electrons and secondary electrons can be provided.

DESCRIPTION OF THE PREFERRED EMBODIMENTS

Figure 1A:
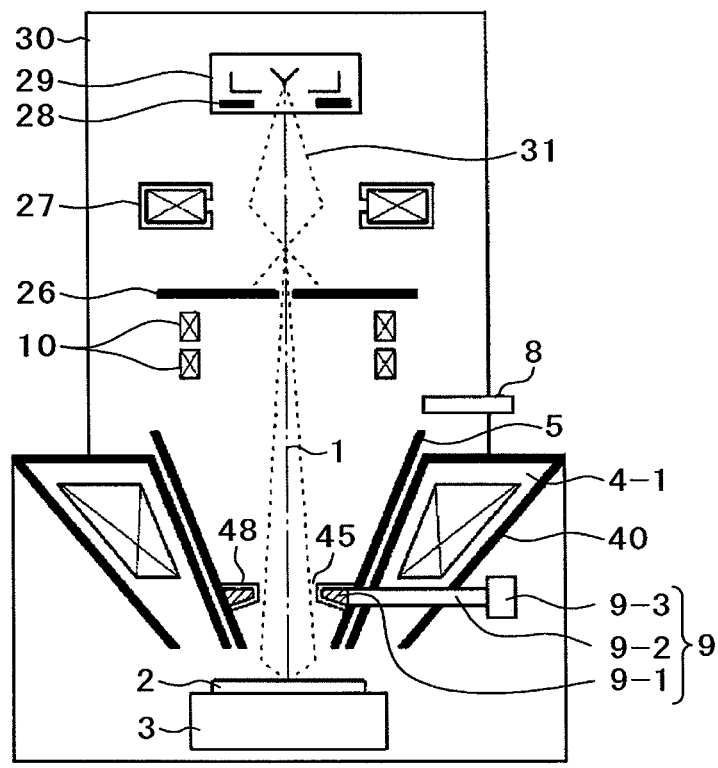
FIG. 1A is a schematic cross-sectional view of a scanning electron microscope according to a first embodiment.

In order to achieve a high resolution in an observation in a low-acceleration region, a scanning electron microscope having an objective lens equipped with a retarding field lens to reduce an aberration exposed at a low acceleration is employed. Such electron optics are configured so that a primary electron beam is retarded immediately before a specimen by an electric field created when a voltage is applied to an electrode arranged in the periphery of the specimen. In general, because an aberration coefficient of the electron optics reduces as a distance WD (Working Distance) between the objective lens and the specimen reduces, it is necessary to draw the specimen close to the objective lens in order to perform a high-resolution observation. However, with such a short WD, frequency of incoming signal electrons to a detector arranged outside a housing cylinder of the scanning electron microscope is reduced, and thus the detection efficiency is also reduced. Therefore, in order to combine both the high-resolution observation and the high detection efficiency at the short WD, a way to detect electrons having passed through the objective lens (TTL: Through The Lens) is preferable.

Hereinafter, for convenience, a signal electron of typically lower than 50 eV having its yield peak with a few eV energy is referred to as a secondary electron, and a signal electron of 50 eV or more and equal to or lower than the irradiation energy of the primary electron beam having its yield peak near the irradiation energy is referred to as a backscattered electron. Moreover, an electron generally having similar level of energy as the secondary electron, which is generated when the backscattered electron impinges on a component of the electron optics, is referred to as a conversion electron to be differentiated from the secondary electron generated by the specimen.

An angle of elevation of the signal electron at the time of generation is defined as below. With respect to a surface of the specimen, the normal direction is defined as 90 degrees, and the horizontal direction is defined as 0 degree. Hereinafter, for convenience, the angle range is divided into a high angle, a medium angle, and a low angle. The near 90-degree angle of elevation is referred to as the high angle, the near 0-degree angle of elevation is referred to as the low angle, and the near 45-degree intermediate range between the high angle and the low angle is referred to as the medium angle.

When the signal electrons are generated by the specimen being irradiated with the primary electron beam, the angular distribution thereof generally follows the cosine law, according to which the yield peak is located near the angle of elevation of 45 degrees especially when the specimen is relatively flat. Therefore, comparing the number of electrons included in the same angle range in the angle of elevation when detecting the electrons in all the azimuth angles, detection of the electrons emitted in the medium angle range is more advantageous than detection of the electrons emitted near the angle of elevation of 0 degree in terms of the detected yield. Thus, it is expected that a backscattered electron image with sufficient contrast can be obtained despite a low amperage of the irradiated electron beam by detecting the backscattered electrons in the angle region with a high yield.

The objective lens of the scanning electron microscope has a lens configuration which utilizes both the retarding field and the magnetic field. When comparing the secondary electrons and the backscattered electrons emitted in the angular direction of the same angle of elevation at the time of generation from the specimen, the backscattered electron with higher energy receives a relatively smaller convergence effect than the secondary electrons with lower energy from the same lens field, and therefore the secondary electrons take trajectories closer to an optical axis than the backscattered electron in locations relatively closer to the specimen. Thus, by providing a detector on a trajectory on which only the backscattered electron taking the trajectory farther away from the optical axis pass, it is possible to selectively detect the backscattered electrons.

Moreover, according to the present invention, it is made possible to detect the signal electrons included in the medium angle range with the high yield by arranging a detector plane of a backscattered electron detector inside an electron transport means (acceleration tube) to have the same potential, thereby providing a low-acceleration scanning electron microscope capable of selectively detecting the backscattered electrons and the secondary electrons despite the low probe current.

Details will be described below with reference to examples.

First Embodiment

A first embodiment of the present invention will be explained with reference to FIGS. 1A, 1B, and 2 to 4. FIG. 1A is an entire schematic configuration diagram of the scanning electron microscope according to the embodiment. The scanning electron microscope shown in FIG. 1A is generally constituted by an electron optics column 30 equipped with a mechanism for emitting a primary electron beam 31 directed to a specimen 2, a specimen holder 3 holding the specimen 2, a specimen holder moving mechanism for placing and moving the specimen 2 to determine an observation region (not shown), a display device for an SEM image (not shown), a controller controlling the whole SEM (not shown), a vacuum exhaust installation (not shown), and the like.

Figure 1B:
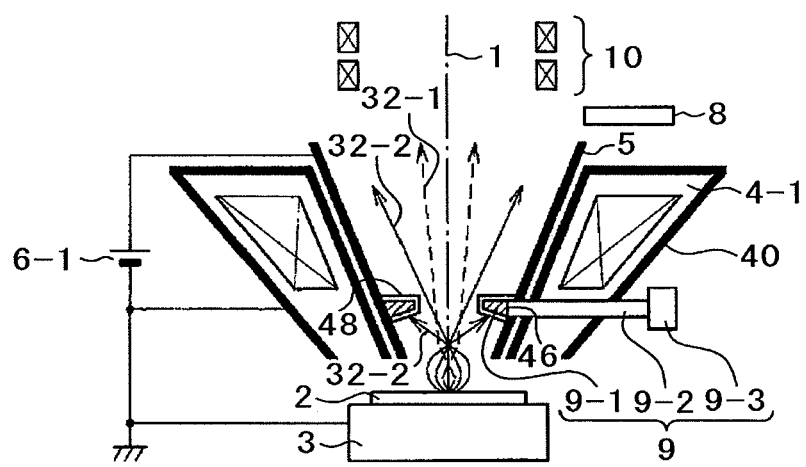
FIG. 1B is a main part schematic cross-sectional view of the scanning electron microscope according to the first embodiment.

The electron optics column 30 is basically constituted by an electron gun (electron source) 29, an acceleration electrode 28, at least one condenser lens 27, an aperture 26, an electron lens serving as an objective lens (shown herein is a semi-in-lens type magnetic lens 4-1), an acceleration tube 5 provided as an electron transport means, a deflector 10 of at least one stage, a secondary electron detector 8, a backscattered electron detector 9, and the like, and FIG. 1B shows the components from the specimen holder 3 to the deflector 10 extracted from the system of the scanning electron microscope. As the electron gun 29, various types of electron guns such as CFE (Cold Field Emission), SE (Shottky Emission), and thermionic emission (Thermionic Emission) can be used. As shown in FIG. 1A, the deflector 10 and the secondary electron detector 8 are located closer to the electron gun 29 than the backscattered electron detector 9. Denoted by 1 is an optical axis, reference numeral 40 is a magnetic path of a magnetic lens, reference numerals 9-1, 9-2, and 9-3 are respectively a scintillator (detector plane), a light guide, and a photomultiplier tube (PMT) of the backscattered electron detector 9, reference numeral 45 is a passing hole for a probe electron beam, and reference numeral 48 is a conductor provided on the surface of the scintillator 9-1. It should be noted that the same denotation refers to the same component.

A conceptual configuration diagram of the part from the deflector 10 to the specimen holder 3 is shown in FIG. 1B. In this embodiment, the objective lens of the scanning electron microscope is the semi-in-lens type magnetic lens 4-1 which intentionally immerses the specimen 2 in the magnetic field. Because the specimen 2 is located in the magnetic immersion field, a high-resolution observation is possible. As shown in FIG. 1B, the acceleration tube 5 has a shape along the tapered portion of the upper magnetic path of the objective lens 4-1, and is arranged as a cylindrical electrode having an open end near the specimen 2 in a space region reserved in a gap above the upper magnetic path of the objective lens 4-1. In consideration of symmetry of the electron optics, an axisymmetric shape of the open end on the acceleration tube 5 is preferred. As shown in FIG. 1B, in this embodiment, both the objective lens 4-1 and the specimen 2 have a ground potential, and the acceleration tube 5 is applied with a positive voltage of 1 kV or higher by a power source 6-1 so as to form the retarding field which achieves a sufficient aberration reduction at a low acceleration. At this time, an insulator (not shown) is provided in the gap between the objective lens 4-1 and the acceleration tube 5 so as to be electrically insulated. In this embodiment, as shown in FIG. 1B, an explanation is given assuming a case where the acceleration tube 5 is provided partially in the region from the proximity of the objective lens 4-1 to the proximity of the secondary electron detector 8, but the method of detecting the signal electrons is basically the same in a case where the installation range of the acceleration tube 5 is expanded to the proximity of the electron gun 29.

Figure 22:
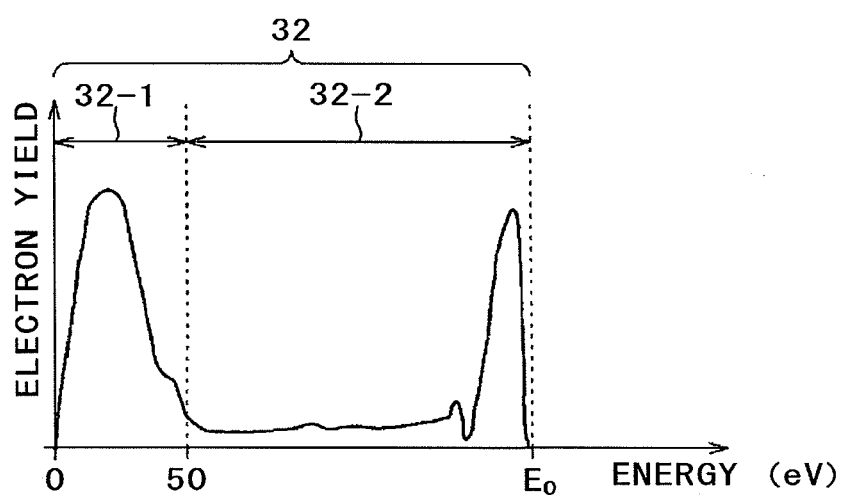
FIG. 22 is a diagram showing an energy distribution map of general emission electrons.

The primary electron beam 31 emitted from the electron gun 29 is accelerated by the acceleration electrode 28, converged by the condenser lens 27, and passes through the aperture 26 to reach the specimen 2. When the primary electron beam 31 is irradiated on the specimen 2, the signal electrons are emitted. An energy distribution map of the signal electrons is shown in FIG. 22. As shown in FIG. 22, typically a signal electron of lower than 50 eV having its yield peak at a few eV energy is referred to as a secondary electron 32-1, and a signal electron of 50 eV or more and equal to or lower than the irradiation energy of the primary electron beam having its yield peak near the irradiation energy is referred to as a backscattered electron 32-2.

When the objective lens is the semi-in-lens type magnetic lens 4-1, a leakage magnetic field near the specimen 2 is large, and the magnetic field of the magnetic lens immerses the specimen 2. Thus, when the accelerating voltage of the primary electron beam 31 is 3 kV or lower during an observation at a short WD, the backscattered electrons 32-2 moving in a opposite direction from the primary electron beam 31 are converged by the lens effect of the objective lens 4-1. Therefore, at the short WD of typically about 1 mm, most of the signal electrons 32 (secondary electrons 32-1, backscattered electrons 32-2) pass through the objective lens 4-1 and proceed into the housing cylinder of the scanning electron microscope.

As shown in FIG. 1B, when the positive voltage is applied to the cylindrical acceleration tube 5 arranged above the upper magnetic path of the objective lens 4-1 by the power source 6-1, the signal electrons are accelerated in the region inside the acceleration tube 5. For example, under the condition where the positive voltage of 6 kV is applied to the acceleration tube 5 by the power source 6-1 and the irradiation energy to the specimen 2 is 1 kV, the energy of the generated signal electrons 32 (secondary electrons 32-1, backscattered electrons 32-2) is 1 keV or lower near the specimen 2. At this time, the energy of the secondary electrons 32-1 is 0-50 eV and the energy of the backscattered electron 32-2 is 50-1,000 eV near the specimen 2, and the energy of the secondary electrons 32-1 is accelerated to 6,000-6,050 eV and the backscattered electron 32-2 is accelerated to 6,050-7,000 eV in the region inside the acceleration tube 5. However, when the acceleration tube 5 is partially installed only near the objective lens 4-1 as in this embodiment, the signal electrons are retarded when they go out into a region outside the acceleration tube 5 to be equal to the energy near the specimen 2. In general, in a detector, the detection sensitivity increases as the detection is performed in more accelerated state because more detection signals can be obtained from electrons with higher energy. Therefore, in order to detect the signal electrons in the accelerated state, the detector plane of the detector needs to be installed inside the acceleration tube 5.

The backscattered electron detector shown in FIG. 1B is a detector based on the detection principle similar to that of an Everhart-Thornley type detector (hereinafter, ET detector). This is commonly used as the signal electron detector of the scanning electron microscope. The configuration of the backscattered electron detector 9 includes the scintillator 9-1 converting the signal electrons into a light, and the photomultiplier tube 9-3 (hereinafter, PMT) converting the light into electrons again and amplifying the electrons, and the scintillator 9-1 and the PMT 9-3 are connected by the light guide 9-2. With this configuration, when the signal electrons enter the scintillator 9-1, the generated light reaches the PMT 9-3 through the light guide 9-2, and the light is converted into electric signals by the PMT 9-3 to be detected. Typically, as long as the signal electrons have high energy of 5 keV or higher when entering into the scintillator 9-1, sufficient light emission occurs which can be detected. On the other hand, when the energy at the time of entering the scintillator 9-1 is lower than 5 keV, the sufficient light emission does not occur, which makes it difficult to detect it. So, by uniformly coating a surface portion of the scintillator 9-1 serving as the detector plane with the conductor 48 such as Al by means of vapor deposition or the like and applying the positive voltage of 5 kV or higher to the portion of the conductor 48, the signal electrons are accelerated before reaching the detector plane of the detector to cause the sufficient light emission even if the energy is lower than 5 keV, which makes the electrons detectable. It should be noted that a film thickness of the conductor 48 film provided on the detector plane of the scintillator 9-1 can be regarded as the uniform film thickness as long as the in-plane distribution is within +/−10%.

The backscattered electron detector 9 shown in FIG. 1B can detect the signal electrons having reached the backscattered electron detector 9 based on the same principle as the ET detector by electrically connecting the portion of the conductor 48 provided to the detector plane to the acceleration tube 5 and achieving the same potential as the positive voltage applied to the acceleration tube 5 by the power source 6-1. That is, when the signal electrons accelerated by the acceleration tube 5 to 5 keV or higher enter the scintillator 9-1, the light emission occurs in the scintillator 9-1. If this light reaches the PMT 9-3 through the light guide 9-2, their output signals become the detection signals of the signal electrons. The scintillator 9-1 and the light guide 9-2 are joined by a connection portion 46. (Shapes of the scintillator will be described later with reference to FIGS. 2, 3, and 4) It is noted that, when the light generated by the scintillator 9-1 reaches a boundary at an angle of incidence smaller than a critical angle, the light proceeds to the outside of the scintillator 9-1. In order to reduce a loss of an amount of such a light, it is beneficial that the light should be reflected inside the scintillator 9-1 by providing a film of the conductor 48 on the surface of the scintillator 9-1. Thus, an improvement of the detection efficiency of the signal electrons can be expected by coating the surface of the scintillator 9-1 with the conductor 48 except the connection portion 46 to the light guide 9-2. Although the conductor is connected to the acceleration tube in the explanation above, the conductor 48 may be connected directly to the power source 6-1 to have the same potential as the acceleration tube.

There are various types of the scintillator 9-1 having different basic properties such as the amount of luminescence and the attenuation time depending on the composition, the dopant to be mixed with, and the like. The scintillator 9-1 is preferably a solid scintillator because it needs to be formed into the shape described later. While there are various types of scintillators, YAG:Ce (yttrium aluminum garnet doped with cerium) is typically used. A cross-sectional shape of the scintillator 9-1 includes, as shown in FIG. 1A, the passing hole 45 for electrons, and its specimen-side end face preferably has a taper so as to be arranged axisymmetric to the optical axis 1. This is because the provision of the taper makes it easier for the light generated inside the scintillator 9-1 to proceed inside the direction of the light guide 9-2, increases the collection efficiency of the light generated inside the scintillator 9-1 by the light guide 9-2, and thereby improves the detection efficiency of the signal electrons. It is desirable to use a connecting means such as optical cement between the scintillator 9-1 and the light guide 9-2 so that the refractive-index change in the connection portion 46 may not be too steep.

Figure 2:
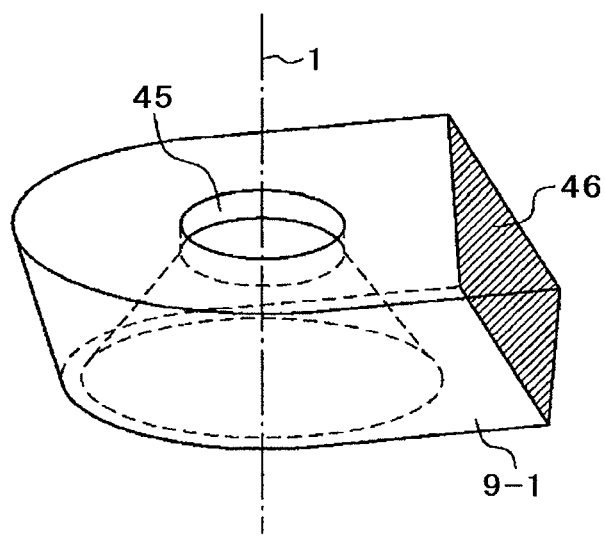
FIG. 2 is a perspective view showing a scintillator shape used in the scanning electron microscope according to the first embodiment.
Figure 3:
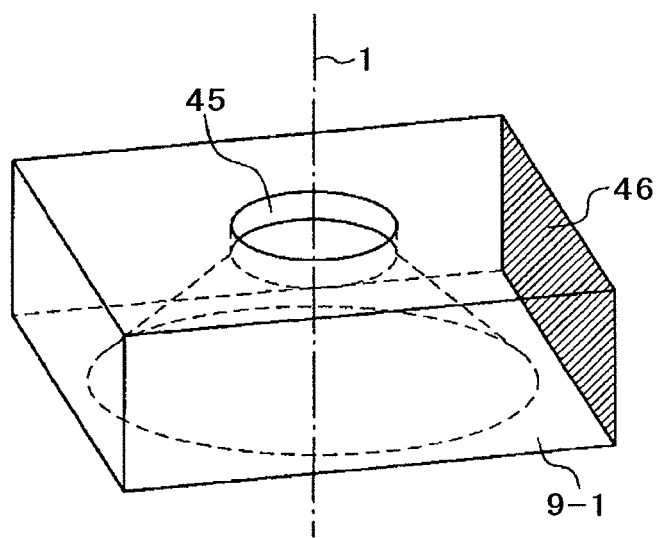
FIG. 3 is a perspective view showing another example of the scintillator shape used in the scanning electron microscope according to the first embodiment.

In a case where there is one pair of the light guide 9-2 and the PMT 9-3 to be connected to the scintillator 9-1, a scintillator shape conically hollowed out as shown in FIG. 2 or 3 having a larger opening on the specimen side and a smaller opening on the electron beam side is desirable. By making such a shape, it is expected that not only the light generated in a region near the connection portion 46 between the scintillator 9-1 and the light guide 9-2 but also the light generated in a region away from the connection portion 46 between the scintillator 9-1 and the light guide 9-2 can be collected in related to the optical axis 1.

Figure 4:
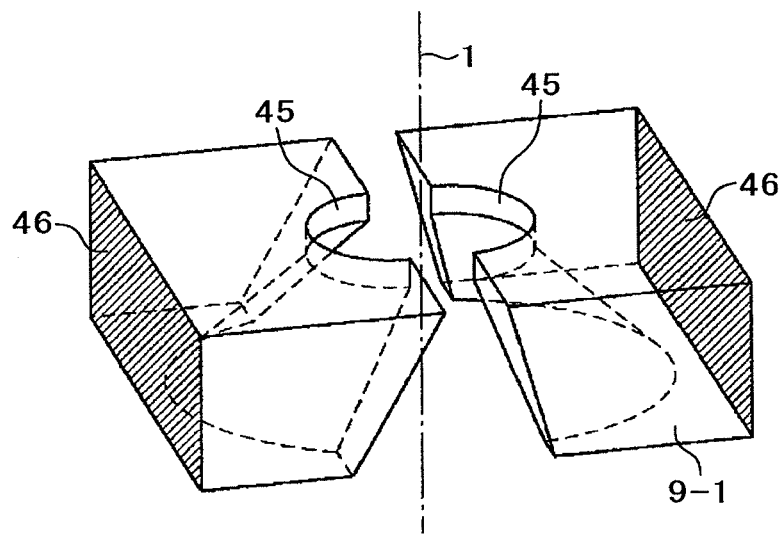
FIG. 4 is a perspective view showing another example of the scintillator shape used in the scanning electron microscope according to the first embodiment.

In a case where two pairs of the light guide 9-2 and the PMT 9-3 are used, the detection efficiency can be improved by dividing the scintillator 9-1 so as to be in a line-symmetric arrangement as shown in FIG. 4 and connecting the light guide and the PMT to each scintillator.

The light guide 9-2 is installed through the magnetic path 40 of the magnetic objective lens, as shown in FIG. 1B. If the symmetry of the lens effect in the magnetic field is significantly impaired by providing a hole in the magnetic path 40 and anisotropically providing the light guide 9-2 only in one direction, for example, it is desirable to provide the magnetic path 40 of the objective lens with holes of the same shape four-hold symmetrically in four directions including the direction of the light guide shown in FIG. 1B so as to achieve an arrangement symmetrical to the optical axis 1.

The principle of the method of selectively detecting the backscattered electrons is explained using FIG. 1B. When the primary electron beam 31 is irradiated on the specimen 2 fixed to the specimen holder 3, the signal electrons emitted from the irradiation point includes the secondary electrons 32-1 and the backscattered electrons 32-2. Directions of arrows are mere examples of moving directions of the signal electrons having energy, and the signal electrons are emitted in not only these directions but also many other directions. The energy distribution of the signal electrons includes, as shown in FIG. 22, lower than 50 eV for the secondary electrons 32-1, and equal to or higher than 50 eV and equal to or lower than the irradiation energy near the specimen 2. The signal electrons 32 (secondary electrons 32-1, backscattered electrons 32-2) generated when the primary electron beam 31 is irradiated proceed in the direction of the electron gun 29 from the surface of the specimen 2. Because the leakage magnetic field immerses near the specimen 2 when the objective lens in the magnetic field is a semi-in-lens type, in an observation at the short WD of typically about 1 mm, comparing the secondary electrons 32-1 and the backscattered electrons 32-2 emitted from the specimen 2 in the same angular direction, the backscattered electron having qualitatively higher energy are less likely to be converged by the lens field than the secondary electrons 32-1, and consequently the secondary electrons 32-1 take the trajectories closer to the optical axis 1 than the backscattered electrons 32-2. On the other hand, the backscattered electrons 32-2 take the trajectories relatively farther away from the optical axis than the secondary electrons 32-1 due to the higher energy than that of the secondary electrons 32-1. Therefore, by setting a caliber of the passing hole 45 provided in the scintillator 9-1 so that most of the secondary electrons 32-1 having 50 eV or lower energy pass through the passing hole 45, it is possible to selectively detect the backscattered electrons 32-2 accelerated by the acceleration tube 5 and emitted nearly in the direction of the medium angle among the backscattered electrons 32-2 having passed through the objective lens 4-1 and proceeded into the housing cylinder of the scanning electron microscope as shown in FIG. 1B. By employing the aforementioned configuration and detecting the backscattered electrons included in the angle range near 45-degree angle of elevation with the high yield separately from the secondary electrons, it is possible to provide the scanning electron microscope capable of obtaining a selective detection image of the backscattered electrons or the signal electrons deriving therefrom having sufficient contrast even if the amperage of the irradiated electron beam is low.

The backscattered electron detectors 9 are arranged closer to the specimen 2 than the deflector 10 provided to scan the primary electron beam 31 on the specimen 2. Because the backscattered electrons 32-2 are detected without passing through a region of a deflection field, an influence by shading can be avoided which causes abnormal contrast of the detection image due to deflection of the trajectories.

As shown in FIG. 1B, the secondary electron detector 8 is installed closer to the electron gun 29 than the backscattered electron detector 9. The signal electrons proceeding closer to the electron source than the backscattered electron detector 9 include the backscattered electrons 32-2 emitted in the low angle and partially medium angle directions that are not detected by the backscattered electron detector 9 in addition to the secondary electrons 32-1, but the secondary electrons 32-1 are predominant in terms of the yield (approximately 1/10 in total amount), and therefore it is expected that an image formed by detecting these signal electrons should reflect information of mainly the secondary electrons.

Although this embodiment was explained assuming a case where the specimen has the ground potential, the backscattered electrons 32-2 can be detected based on the similar principle even when the retarding method of applying a negative voltage to the specimen holder 3 is employed under the aforementioned condition in order to further reduce the aberration in the low-acceleration region. When the retarding voltage is applied, the signal electrons are accelerated by the retarding field formed between the magnetic path of the objective lens 4-1 and the specimen 2. Thus, when applying the retarding voltage, the detection sensitivity of the detector in the acceleration tube 5 does not change even if the voltage applied to the acceleration tube 5 is lower by the retarding voltage. However, the angle region of the backscattered electrons 32-2 to be detected will change because the trajectories of the signal electrons are changed by applying the retarding voltage and changing the voltage applied to the acceleration tube 5.

When the observation of a biological specimen was carried out setting the irradiation energy to 1 keV and the probe current to 10 pA to 100 pA using the scanning electron microscope according to this embodiment, the secondary electrons and the backscattered electrons were selectively detected with good results.

As described above, this embodiment can provide the low-acceleration scanning electron microscope capable of selectively detecting the backscattered electrons and the secondary electrons despite the low probe current by using the signal electrons included in the medium angle range presenting the high yield.

Second Embodiment

Figure 5A:
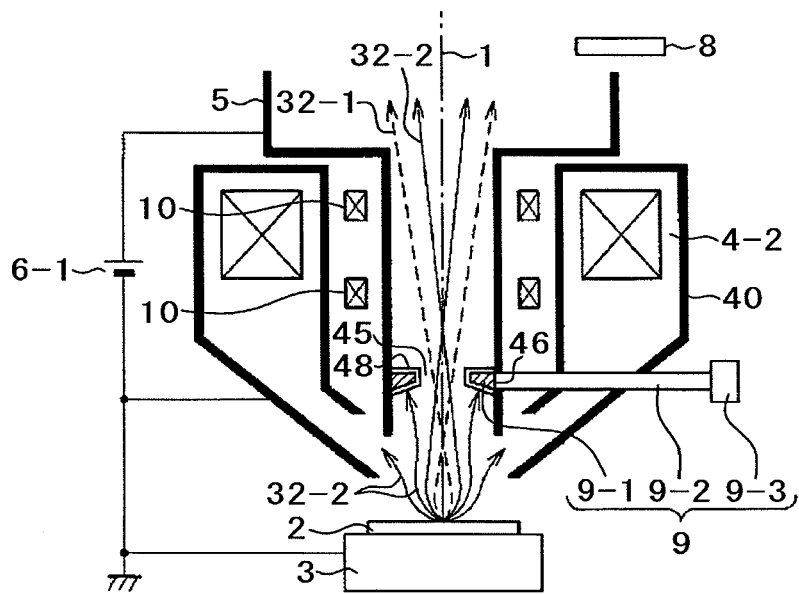
FIG. 5A is a main part schematic cross-sectional view of a scanning electron microscope according to a second embodiment.

A second embodiment will be explained with reference to FIGS. 5A to 5C. It should be noted that matters described in the first embodiment but not in this embodiment can be applied to this embodiment unless otherwise specified. FIG. 5A is a main part schematic cross-sectional view of a scanning electron microscope according to this embodiment.

This figure shows the components from the specimen holder 3 to the secondary electron detector 8 extracted from the system of the scanning electron microscope constituted by the electron gun 29, the acceleration electrode 28, the condenser lens 27, the aperture 26, the electron lens serving as the objective lens, the acceleration tube 5 for electrons, the deflector 10, the detector 8 for secondary electron detector 9 for backscattered electrons, the specimen holder 3 on which the specimen 2 is placed, the specimen holder moving mechanism for moving the specimen holder 3 to determine the observation region, the display device for an SEM image, the controller controlling the whole SEM, the vacuum exhaust installation, and the like. As the electron gun 29, various types of electron guns such as CFE, SE, and thermionic emission can be used. As shown in FIG. 5A, the deflector 10 and the secondary electron detector 8 are located closer to the electron gun 29 than the backscattered electron detector 9.

In this embodiment, the objective lens of the scanning electron microscope is constituted by the magnetic lens and an electrostatic lens, and the magnetic lens is of an out-lens type 4-2 which does not immerse the specimen in the magnetic field. Unlike the semi-in-lens type described in the first embodiment, because the lens principal plane of the magnetic lens is spaced away from the specimen, the on-axis magnetic field strength near the specimen 2 is lower than the case of the semi-in-lens type objective lens. This enables an observation of a magnetic specimen. As shown in FIG. 5A, the acceleration tube 5 provided as the electron transport means is arranged as a cylindrical electrode along the upper magnetic path of the objective lens 4-2 in the space region reserved in the gap between the upper magnetic path of the objective lens 4-2 and the optical axis 1. The acceleration tube 5 is applied with the positive voltage of 1 kV or higher by the power source 6-1, and the open end portion of the acceleration tube 5 on the specimen 2 side is arranged extending to the proximity of the specimen 2 so as to form the lens field of the retarding field (see FIG. 5B or 5C) which may sufficiently contribute to reduction of the lens aberration in the low-acceleration region of 3 kV or lower in the space in between with the specimen having the ground potential.

The insulator (not shown) is provided in the gap between the objective lens 4-2 and the acceleration tube 5 so as to be electrically insulated. In this embodiment, as shown in FIG. 5A, an explanation is given regarding a method of detecting the signal electrons 32 (secondary electrons 32-1, the backscattered electrons 32-2) in the case where the acceleration tube 5 is provided partially near the objective lens 4-2, but the method of detecting the signal electrons is the same in a case where the installation range of the acceleration tube 5 is extended to the proximity of the electron gun 29. It is noted that the ET detector is used in the configuration of the backscattered electron detector 9 as in the first embodiment. The shape of the scintillator 9-1, the configuration and the arrangement of the light guide 9-2 and the PMT 9-3 are same as the first embodiment.

Figure 5B:
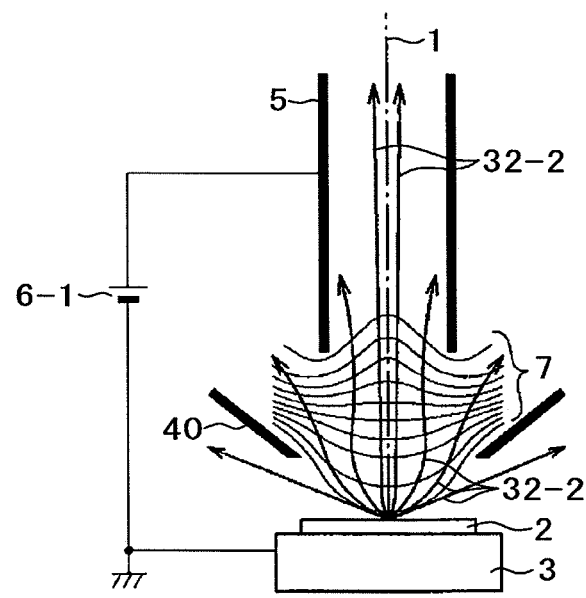
FIG. 5B is a main part cross-sectional view for explaining a motion of a backscattered electron in the scanning electron microscope according to the second embodiment.
Figure 5C:
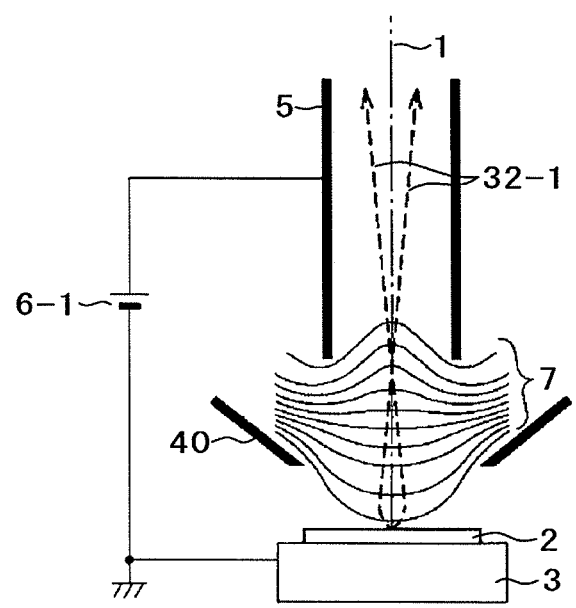
FIG. 5C is a main part cross-sectional view for explaining a motion of a secondary electron in the scanning electron microscope according to the second embodiment.

The principle of the method of selectively detecting the backscattered electrons is explained using FIGS. 5B and 5C. The retarding field 7 formed between the acceleration tube 5 and the specimen 2 is characterized by an equipotential surface shown in FIGS. 5B and 5C.

The signal electrons emitted from the specimen 2 fixed to the specimen holder 3 include the secondary electrons 32-1 and the backscattered electrons 32-2. Directions of arrows are mere examples of moving directions of the signal electrons having energy, and the signal electrons are emitted in not only these directions but also many other directions. The signal electrons generated at the specimen 2 include, as shown in FIG. 22, lower than 50 eV for the secondary electrons 32-1, and equal to or higher than 50 eV and equal to or lower than the irradiation energy for the backscattered electrons 32-2.

For example, focus on the specimen 2 is adjusted by applying the positive voltage of 8 kV to the acceleration tube 5 using the power source 6-1 and adjusting the lens magnification of the magnetic lens 4-2. In this manner, the reduction of the aberration coefficient can be expected especially in the low-acceleration region of 3 kV or lower accelerating voltage. Unlike the first embodiment, the leakage magnetic field near the specimen 2 is smaller when the out-lens type magnetic lens 4-2 is used, and the convergence effect of the retarding field 7 by the retarding field 7 is mainly used than the magnetic lens 4-2 when used in the low-acceleration region of 3 kV or lower. Thus, the secondary electrons 32-1 having 50 eV or lower energy proceeding in the opposite direction from the primary electron beam 31 generated from the specimen 2 by the convergence effect of the retarding field 7 receive the sufficient convergence effect, but do not have a high converging capability enough to converge the backscattered electrons 32-2 having high energy of 1 keV or higher. Therefore, as shown in FIG. 5B, most of the backscattered electrons 32-2 generated in the low-angle direction do not proceed into the acceleration tube 5 of the scanning electron microscope, and the backscattered electrons 32-2 proceeding into the acceleration tube 5 are limited to the backscattered electrons 32-2 generated in the high-angle to medium-angle direction. On the other hand, because the sufficient lens effect by the retarding field 7 works on the secondary electrons 32-1, most of the secondary electrons 32-1 generated in the full angle range are converged and proceed through the acceleration tube 5 at the short WD of typically 5 mm, as shown in FIG. 5C.

As described above, the signal electrons proceeding through the acceleration tube 5 include the secondary electrons 32-1 included in the full angle range and the backscattered electrons 32-2 generated in the high-angle to medium-angle direction. The backscattered electrons 32-2 take the trajectories relatively farther away from the optical axis 1 than the secondary electrons 32-1 when comparing trajectories of the signal electrons emitted in the same angular direction, because the backscattered electrons 32-2 have higher energy than the secondary electrons 32-1. The difference between the trajectories is smaller with regard to the signal electrons emitted in the high-angle direction of the specimen, but the difference between the trajectories appears larger with the signal electrons emitted in the direction of the lower angle. Therefore, like the first embodiment, with regard to the signal electrons detected by the backscattered electron detector 9, by setting the caliber of the electron passing hole 45 provided in the scintillator 9-1 allowing most (possible all) of the secondary electrons 32-1 to pass through the passing hole 45 provided in the scintillator 9-1 so that the secondary electrons 32-1 emitted in the low-angle direction proceeding into the acceleration tube 5 of the scanning electron microscope are sufficiently less than the backscattered electrons, it is possible to selectively detect those emitted in the medium-angle direction from among the backscattered electrons 32-2 having passed through the objective lens 4-2 and proceeded into the acceleration tube 5 of the scanning electron microscope.

When the observation of the magnetic specimen was carried out setting the irradiation energy to 1 keV and the probe current to 10 pA to 100 pA using the scanning electron microscope according to this embodiment, the secondary electrons and the backscattered electrons were selectively detected with good results.

As described above, this embodiment can provide the low-acceleration scanning electron microscope capable of selectively detecting the backscattered electrons and the secondary electrons despite the low probe current by using the signal electrons included in the medium angle range presenting the high yield. It is also possible to observe a magnetic body by using the out-lens type magnetic lens as the objective lens.

Third Embodiment

Figure 6:
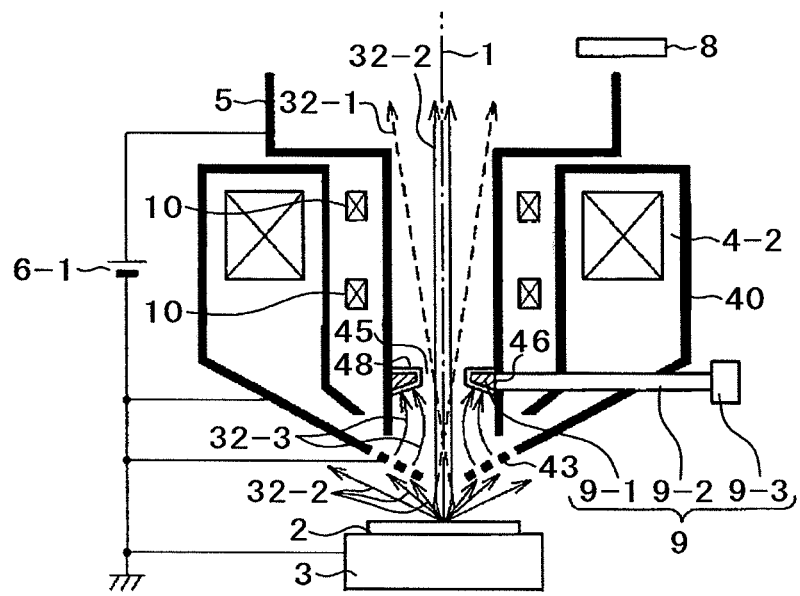
FIG. 6 is a main part schematic cross-sectional view of a scanning electron microscope according to a third embodiment.

A third embodiment will be explained with reference to FIGS. 6 to 15. It should be noted that matters described in the first or second embodiment but not in this embodiment can be applied to this embodiment unless otherwise specified. FIG. 6 is a main part schematic cross-sectional view of a scanning electron microscope according to this embodiment.

This figure shows the components from the specimen holder 3 to the secondary electron detector 8 extracted from the system of the scanning electron microscope constituted by the electron gun 29, the acceleration electrode 28, the condenser lens 27, the aperture 26, the electron lens serving as the objective lens, the acceleration tube 5 for electrons, the deflector 10, the detector 8 for secondary electron detector 9 for backscattered electrons, the specimen holder 3 on which the specimen 2 is placed, the specimen holder moving mechanism for moving the specimen holder 3 to determine the observation region, the display device for an SEM image, the controller controlling the whole SEM, the vacuum exhaust installation, and the like. As the electron gun 29, various types of electron guns such as CFE, SE, and thermionic emission can be used. As shown in FIG. 6, the deflector 10 and the secondary electron detector 8 are installed closer to the electron gun 29 than the backscattered electron detector 9.

As in the second embodiment, the insulator (not shown) is provided in the gap between the objective lens 4-2 and the acceleration tube 5 so as to be electrically insulated. In this embodiment, as shown in FIG. 6, an explanation is given regarding a method of detecting the signal electrons 32 (secondary electrons 32-1, the backscattered electrons 32-2) in the case where the acceleration tube 5 is provided partially near the objective lens 4-2 equipped with the electrostatic lens and the out-lens type magnetic lens, but the detecting method is the same in a case where the installation range of the acceleration tube 5 is extended to the proximity of the electron gun 29. It is noted that the ET detector is used in the configuration of the backscattered electron detector 9 as in the second embodiment.

In this embodiment, a conversion electrode 43 is provided between the objective lens 4-2 and the specimen 2, and it is used as a conversion plate to generate conversion electrons 32-3 serving as the secondary electrons when the backscattered electrons 32-2 impinge thereon.

The conversion electrode 43 is provided so that the retarding field 7 between the objective lens 4-2 and the specimen 2 (see FIG. 7 or 8) gradually changes on the optical axis 1 near the specimen 2. In this embodiment, both the conversion electrode 43 and the specimen 2 have the ground potential. In the second embodiment, an inclined observation of the specimen is difficult because the electric field suddenly changes between the grounded specimen and the acceleration tube. It is also difficult to adjust the optical axis 1 of the electron optics if there is a local roughness on the surface of the specimen which may disturb the uniformity of the retarding field 7. In this regard, in this embodiment, the inclined observation of the specimen 2 is possible because the local turbulence of the retarding field can be minimized by installing the conversion electrode 43 having the same potential as the specimen 2.

When detecting the backscattered electrons 32-2 by the method of the second embodiment, the backscattered electrons 32-2 with 1 keV or higher energy emitted in the medium-angle to low-angle direction which do not proceed into the acceleration tube 5 of the scanning electron microscope cannot be detected by the acceleration tube 5 of the scanning electron microscope. So, in order to detect the backscattered electrons 32-2 with 1 keV or higher energy emitted in the medium-angle to low-angle direction from among the backscattered electrons 32-2 emitted from the specimen 2 separately from the secondary electrons 32-1, only the backscattered electrons 32-2 are converted to the conversion electrons 32-3 by the conversion electrode 43, which are detected in the housing cylinder of the scanning electron microscope. This will be detailed below.

When the signal electrons impinge on the conversion electrode 43, the conversion electrons 32-3 are generated. The conversion electrons 32-3 are known to have its yield peak near about 1 keV energy of the signal electrons impinging on the conversion electrode 43. Moreover, it is preferable to use the conductor, typically gold (Au, atomic number 79) as a high-yield material because the yield of the conversion electron 32-3 varies depending on the material of the conversion electrode 43. Although there are many materials presenting a higher yield than the conductor among the insulator materials, it is desirable to use the conductor in the conversion electrode because it is not desirable based on the detection principle that the conversion electrode may be charged by the impingement of the signal electrons to change the yield. The conversion electrons 32-3 in the conversion electrode 43 are in the range of about a few tens nm from the surface of a portion impinged by the signal electrons. Thus, a part to be the base of the conversion electrode 43 may be formed of a conductor such as Al, and its surface may be formed with another conductor film with higher conversion efficiency by means of vapor deposition or the like. The film thickness of this conductor with high efficiency is preferably 50 nm or more.

When the signal electrons impinge on the conversion electrode 43 with the energy lower than near 1 keV, the energy lost inside the conversion electrode 43 is small and the yield of the conversion electron 32-3 is low. Thus, the conversion electrons 32-3 are hardly generated when the signal electrons with 50 eV or lower impinge on the conversion electrode 43. Therefore, in a case where both the specimen 2 and the conversion electrode 43 are set to the same potential, the incident energy of the signal electrons to the conversion electrode 43 is equal to the energy at the time of generation at the specimen 2, and therefore the conversion electrons 32-3 are hardly generated even if the secondary electrons 32-1 with 50 eV or lower may impinge on the conversion electrode 43.

Figure 7:
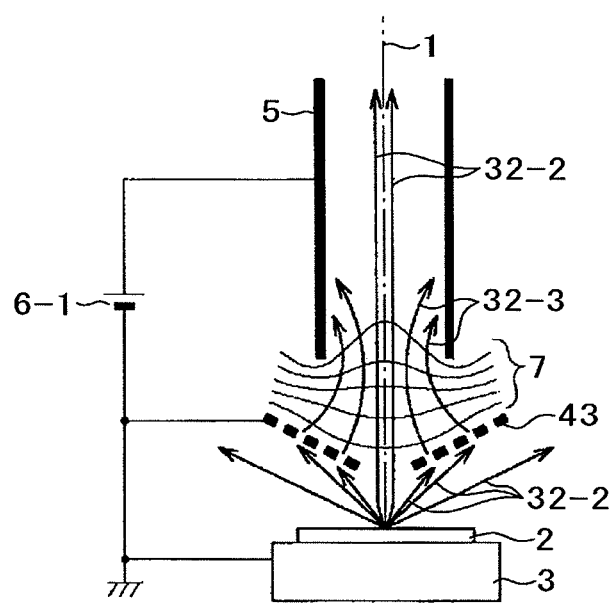
FIG. 7 is a main part cross-sectional view for explaining motions of the backscattered electron and the conversion electron in the scanning electron microscope according to the third embodiment.
Figure 8:
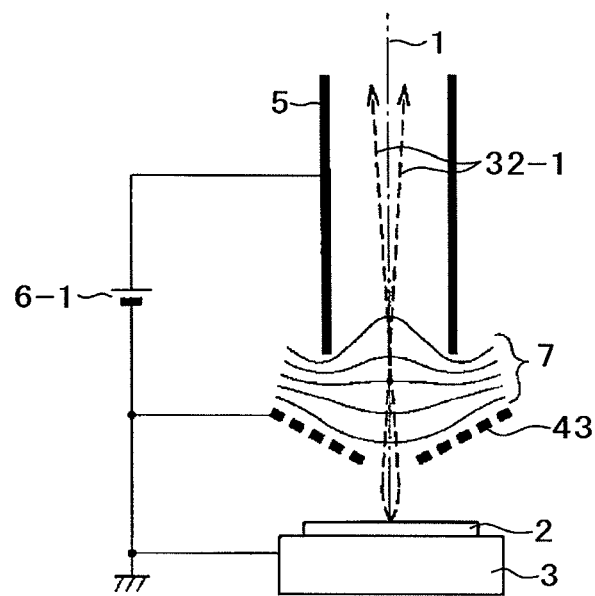
FIG. 8 is a main part cross-sectional view for explaining a motion of the secondary electron in the scanning electron microscope according to the third embodiment.

The principle of the method of selectively detecting the backscattered electrons is explained using FIGS. 7 and 8. The signal electrons emitted from the specimen 2 fixed to the specimen holder 3 include the secondary electrons 32-1 and the backscattered electrons 32-2. Directions of arrows are mere examples of moving directions of the signal electrons having energy, and the signal electrons are emitted in not only these directions but also many other directions. The signal electrons generated at the specimen 2 include, as shown in FIG. 22, lower than 50 eV for the secondary electrons 32-1, and equal to or higher than 50 eV and equal to or lower than the irradiation energy for the backscattered electrons 32-2. Some of the signal electrons generated at the specimen 2 proceed in the direction of the electron gun 29 from the surface of the specimen 2.

When the irradiation energy is 3 kV or lower and the backscattered electrons 32-2 having energy equal to or higher than 50 eV and equal to or lower than 3.0 keV impinge on the conversion electrode 43, it is expected that one or more conversion electrons 32-3 are generated from each backscattered electron 32-2. By selectively detecting the conversion electrons in the acceleration tube 5 of the scanning electron microscope, the signal deriving from the backscattered electrons 32-2 can be obtained. This will be detailed below.

The retarding field 7 formed between the acceleration tube 5 and the conversion electrode 43 is characterized by the equipotential surface shown in FIG. 7. When such a retarding field 7 is formed, the conversion electrons 32-3 generated on the surface of the conversion electrode 43 shown in FIG. 7 receive the convergence effect toward the specimen 2 side opening portion of the acceleration tube 5 according to the lens effect by the electric field, and then, after passing through the opening portion, receive a divergence effect. Thus, the typical trajectories of the conversion electrons 32-3 are as shown in FIG. 7. Moreover, the conversion electrons 32-3 generated at the conversion electrode 43 have typically 50 eV or lower energy at the time of generation, but they are accelerated before reaching an inner wall of the acceleration tube 5 due to the potential difference between the conversion electrode 43 and the acceleration tube 5. Thus, given that, for example, the positive voltage of 6 kV is applied to the acceleration tube 5 by the power source 6-1 and 3 eV conversion electrons 32-3 are generated at the conversion electrode 43, they are accelerated to 6003 eV when they reach the inner wall of the acceleration tube 5. Therefore, the signals deriving from the backscattered electrons 32-2 can be detected with high multiplication by detecting the conversion electrons 32-3 using the backscattered electron detector 9 installed in the acceleration tube 5.

On the other hand, most of the secondary electrons 32-1 generated at the specimen 2 proceed into the acceleration tube 5 of the scanning electron microscope through the passing hole 45 for the primary electron beam 31 provided in the conversion electrode 43, ad proceed through the acceleration tube 5 in the opposite direction from the primary electron beam 31 on the trajectories shown in FIG. 8. The inner diameter of the conversion electrode 43 is determined here so that at least most of the secondary electrons 32-1 equal to or lower than 50 eV may pass through the electron passing hole 45. It is noted that the conversion electrons 32-3 are hardly generated even if the secondary electrons 32-1 impinge on the conversion electrode 43 because the energy of the secondary electrons 32-1 is as low as below 50 eV when impinging on the conversion electrode 43 for the reason described above.

Thus, by arranging the backscattered electron detector 9 on the inner wall of the acceleration tube 5 reached by the conversion electrons 32-3 deriving from the backscattered electrons 32-2 in a region through which the secondary electrons 32-1 do not pass inside the acceleration tube 5 of the scanning electron microscope, it is possible to selectively detecting the signals deriving from the backscattered electrons 32-2. The shape and arrangement of the backscattered electron detector 9 will be detailed later.

The shape of the conversion electrode 43 will be described below. The role of the conversion electrode 43 as a ground electrode is to ease the change of the retarding field 7 on the optical axis 1 near the specimen 2 and to enable the observation of the inclined specimen 2 and the observation of the specimen 2 having roughness on the surface. On the other hand, the role of the conversion electrode 43 as the conversion plate is to effectively generate the conversion electrons 32-3 when the backscattered electrons 32-2 impinge thereon and to emit them so as to proceed into the acceleration tube 5 of the scanning electron microscope. The shape and the aperture ratio of the conversion electrode 43 must be set to satisfy these functions.

Schematic diagrams of the conversion electrode 43 are shown in FIGS. 9 to 12.

Figure 9:
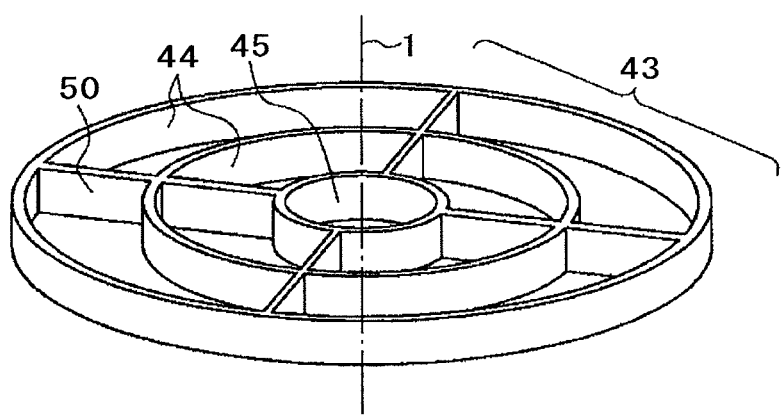
FIG. 9 is a main part perspective view of the scanning electron microscope according to the third embodiment.
Figure 10:
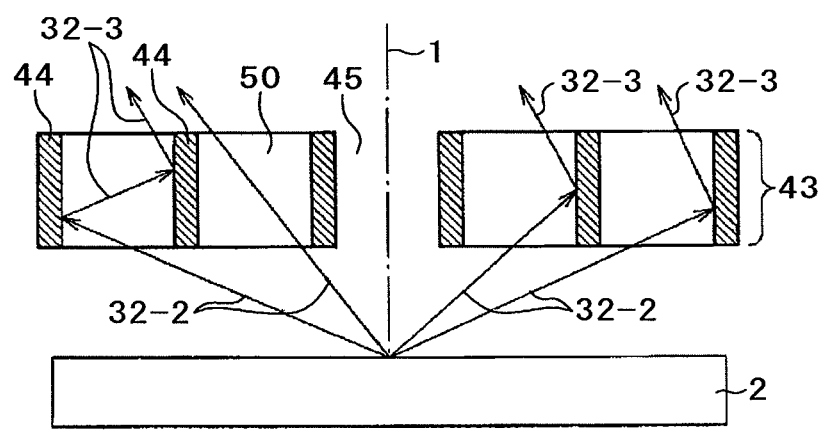
FIG. 10 is a main part cross-sectional view of the scanning electron microscope according to the third embodiment.
Figure 11:
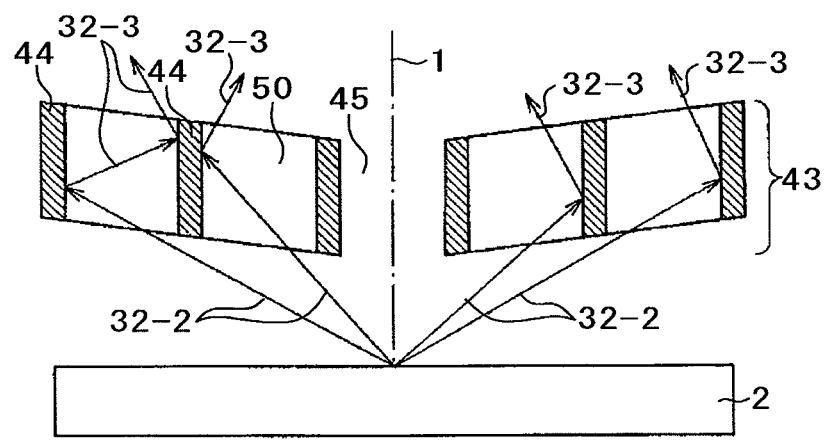
FIG. 11 is a main part cross-sectional view of the scanning electron microscope according to the third embodiment.
Figure 12:
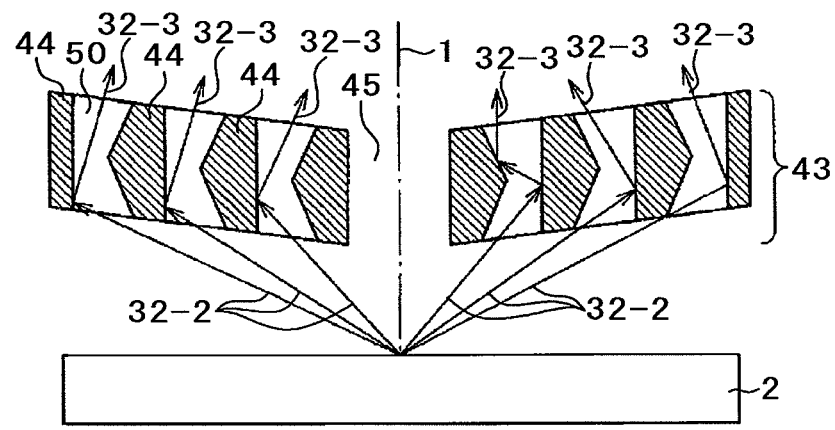
FIG. 12 is a main part cross-sectional view of the scanning electron microscope according to the third embodiment.

FIG. 9 shows a shape where ring-shaped conversion plates 44 arranged concentrically are fixed by a post 50. The electrode closest to the optical axis 1 preferably has an axisymmetric shape because it will serve as the passing hole 45 for the primary electron beam 31 and the secondary electrons 32-1. The aperture ratio of the conversion electrode 43 depending on the distance between the respective conversion plates 44 is determined in consideration of the conversion efficiency of the backscattered electrons 32-2. As an examples of the shape of the conversion electrode 43, the conversion electrode 43 shown in FIG. 9 having a cross section shaped as shown in FIGS. 10 to 12 may be conceivable. FIG. 10 shows an example where three ring-shaped conversion plates 44 with the same thickness in the direction parallel to the optical axis are arranged concentrically. FIG. 11 shows an example where the three ring-shaped conversion plates 44 shown in FIG. 10 are arranged with the conversion plate 44 closer to the optical axis being located closer to the specimen 2. By making the conversion electrode 43 in the shape as shown in FIG. 10, the tip of the conversion electrode 43 extends from the tip of the objective lens 4-2 toward the specimen, thereby retaining the short WD even when observing the inclined specimen 2. Moreover, in a case of the shape as shown in FIG. 10 or 11, when setting a certain WD, especially a long WD, some of the backscattered electrons 32-2 may probably proceed directly into the acceleration tube 5 of the scanning electron microscope without impinging on the conversion plate. In order to avoid this, the cross-sectional shape as shown in FIG. 12 is desirable, which achieves a configuration with which the backscattered electrons 32-2 impinge on the conversion plate 44 easily generating the conversion electrons 32-2 even when the WD is changed.

Figure 13:
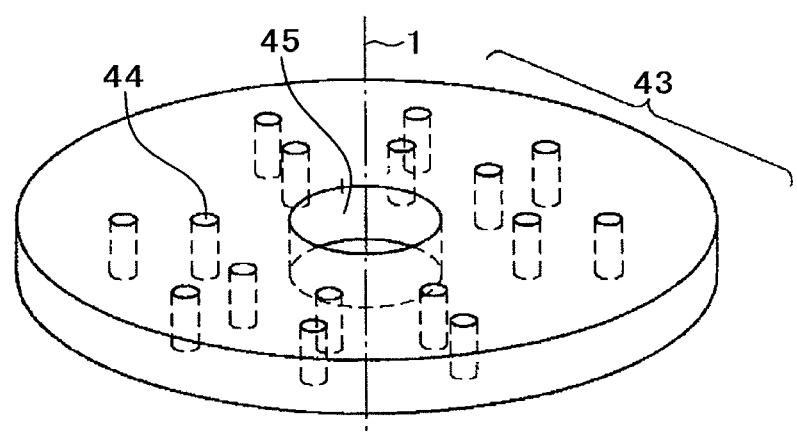
FIG. 13 is a main part cross-sectional view of the scanning electron microscope according to the third embodiment.

FIG. 13 shows a shape where the conversion electrode 43 is provided with the passing hole 45 for the primary electron beam 31 and a large number of the conversion holes 44 for the backscattered electrons 32-2. By making the cross-sectional shape of the conversion electrode 43 in this case as shown in FIGS. 10 to 12, the effect similar to the above can be expected. The shape of the conversion electrode 43 is not limited to the shapes shown in FIGS. 9 to 12 but the similar shapes having the same function can be equated with this. At a relatively high accelerating voltage of 5 keV or higher, by superimposing a plurality of the conversion electrodes shown in FIGS. 9 to 13, the backscattered electrons 32-2 having lost energy at the first conversion electrode can easily emit the conversion electrons 32-3 at the second and later conversion electrodes, whereby the similar conversion effect of the backscattered electrons 32-2 can be expected.

The shape of the scintillator 9-1 constituting the backscattered electron detector 9 is described below. As with the first and second embodiments, the scintillator must be installed in the region on the trajectories where the secondary electrons do not pass but only the conversion electrons deriving from the backscattered electrons pass. Therefore the scintillator 9-1 may have the shape as shown in FIG. 2 or 3 as with the first and second embodiments.

Figure 14:
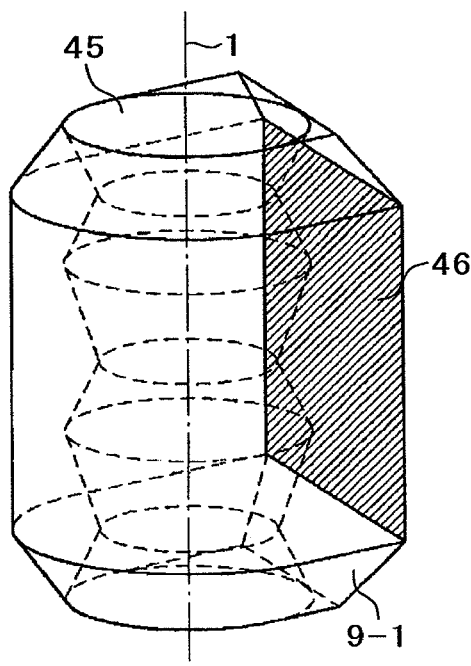
FIG. 14 is a perspective view showing another example of the scintillator shape used in the scanning electron microscope according to the third embodiment.
Figure 15:
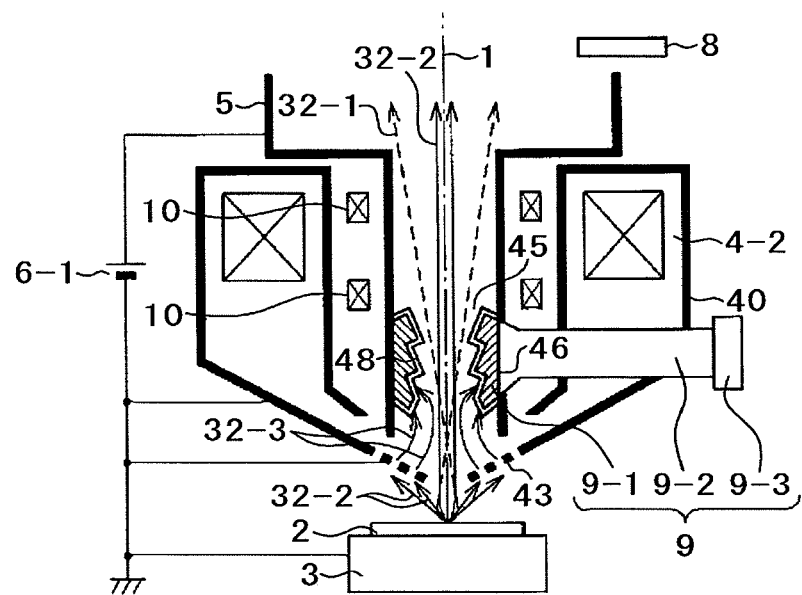
FIG. 15 is a main part schematic cross-sectional view of the scanning electron microscope according to the third embodiment.

When detecting the conversion electrons 32-3 using the backscattered electron detector 9 in the acceleration tube 5, the arrival point of each conversion electron 32-3 in the acceleration tube 5 may vary depending on the distribution of the retarding field 7, generation point of the conversion electron 32-3, the energy at the time of generation, and the angle of emission. Thus, when the scintillator 9-1 is made into such a shape as shown in FIG. 2 or 3, it is necessary to set the caliber of the passing hole 45 for the primary electron beam 31 provided in the scintillator 9-1 so as to let most of the secondary electrons 32-1 pass therethrough and to detect most of the conversion electrons 32-3 alone. When the observation condition such as the lens magnification in the magnetic field or the WD changes, the trajectories of the secondary electrons 32-1 also change, and therefore the caliber of the passing hole 45 for the primary electron beam 31 must be set larger. On the other hand, by making the caliber of the passing hole 45 larger, the detection efficiency of the conversion electrons 32-3 is reduced, which is not desirable. In order to avoid this, the shape of the scintillator 9-1 as shown in FIGS. 14 and 15 is preferable. This shape has a structure of a plurality of the scintillators shaped as shown in FIG. 3 connected in the direction of the optical axis 1. Compared with the case of the scintillators shown in FIGS. 2 and 3, this allows for detecting the conversion electrons coming into a larger area of the inner wall of the acceleration tube 5 near its open end on the specimen side, while retaining a larger opening diameter of the passing hole 45 for the primary electron beam 31 and the secondary electrons 32-1. In this manner, high detection efficiency of the conversion electrons 32-3 is available, whereby an image of the backscattered electrons 32-2 with sufficient contrast can be obtained.

When the observation of the biological specimen was carried out setting the irradiation energy to 3 keV and the probe current to 10 pA to 100 pA using the scanning electron microscope according to this embodiment, the secondary electrons and the backscattered electrons were selectively detected with good results. As described above, this embodiment can provide the low-acceleration scanning electron microscope capable of selectively detecting the backscattered electrons and the secondary electrons despite the low probe current by using the signal electrons included in the medium angle range presenting the high yield. It is also possible to detect the signals deriving from the backscattered electrons with high multiplication by using the conversion electrode.

Fourth Embodiment

Figure 16:
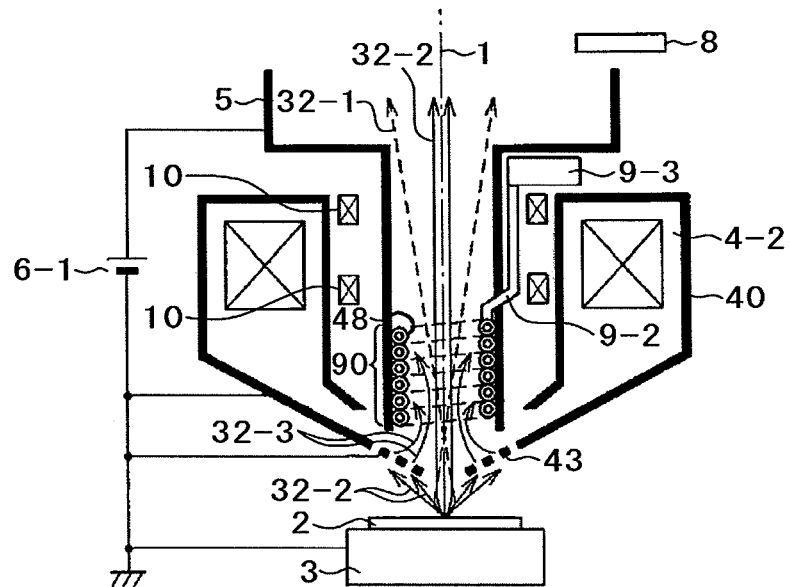
FIG. 16 is a main part cross-sectional view of a scanning electron microscope according to a fourth embodiment.

A fourth embodiment will be explained with reference to FIGS. 16 to 19. It should be noted that matters described in any of the first to third embodiments but not in this embodiment can be applied to this embodiment unless otherwise specified. FIG. 16 is a main part cross-sectional view of a scanning electron microscope according to this embodiment.

This figure shows the configuration of the backscattered electron detector 9 extracted from the system of the scanning electron microscope constituted by the electron gun 29, the acceleration electrode 28, the condenser lens 27, the aperture 26, the electron lens serving as the objective lens, the acceleration tube 5 for electrons, the deflector 10, the secondary electron detector 8 and the backscattered electron detector 9, the specimen holder 3 on which the specimen 2 is placed, the specimen holder moving mechanism for moving the specimen holder 3 to determine the observation region, the display device for an SEM image, the controller controlling the whole SEM, the vacuum exhaust installation, and the like.

Figure 17:
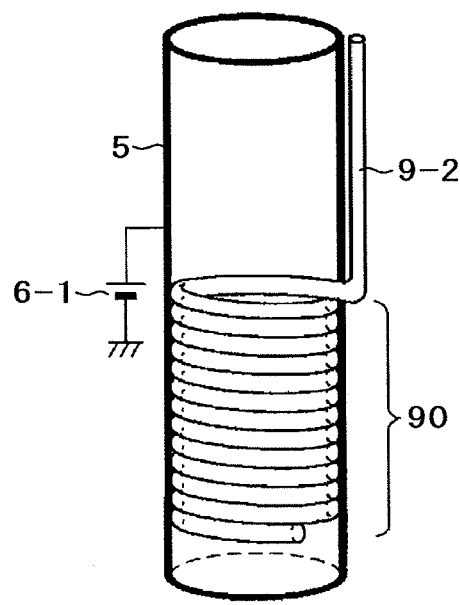
FIG. 17 is a main part perspective view of the scanning electron microscope according to the fourth embodiment.
Figure 18:
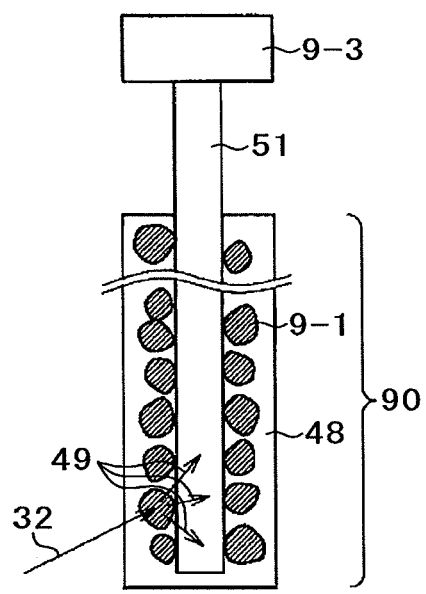
FIG. 18 is a main part perspective view of the scanning electron microscope according to the fourth embodiment.

A case of a configuration different from the third embodiment will be explained using the backscattered electron detector 9 based on the principle of the ET detector described in the third embodiment. This embodiment uses an optical fiber 51 (see FIG. 18) with a few mm diameter as the light guide 9-2. An arrangement of the optical fiber 51 in the acceleration tube 5 is shown in FIG. 17. It is arranged helically along the inner wall of the acceleration tube 5. As shown in FIG. 18, the surface of the optical fiber 51 is fixed with the powdery scintillator 9-1 in a relatively uniform manner, the surface of which is provided with the film of the conductor 48 such as Al, and the portion of the conductor 48 is electrically connected to have the same potential as the acceleration tube 5. It should be noted that, because the PMT 9-3 and the acceleration tube 5 need to be electrically insulated, a portion 90 where a conductor is provided thereon is limited to the portion to be housed in the acceleration tube 5 as shown in FIGS. 17 and 18.

The signal electrons 32 proceeded into the acceleration tube 5 emits a light when impinging on the scintillator 9-1, and when this light 49 enters the optical fiber 51, a part of the light repeats the total reflection to reach the PMT 9-3. This allows for the detection based on the principle similar to the third embodiment. Such a configuration of the detector eliminates the necessity of proving a hole for the magnetic path 40 of the magnetic objective lens to penetrate the light guide, and the use of the optical fiber 51 can improve the degree of freedom for setting the light guide 9-2.

Figure 19:
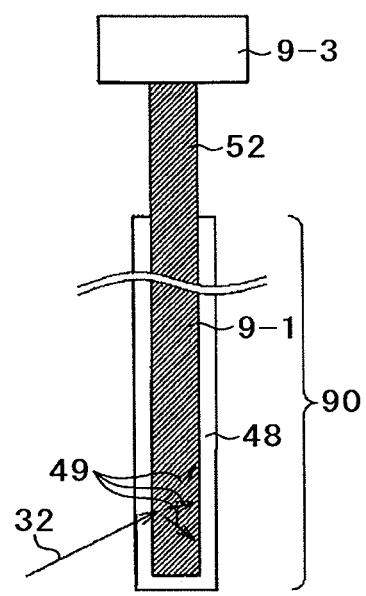
FIG. 19 is a main part schematic perspective view of the scanning electron microscope according to the fourth embodiment.

In order to obtain the similar effect, the portions of the optical fiber 51 and the scintillator 9-1 may be replaced by a scintillating fiber 52. The scintillating fiber 52 itself combines the roles of both the scintillator and the light guide, having a cross-sectional shape as shown in FIG. 19. By providing the surface with the conductor 48 film such as Al as shown in FIG. 19 and electrically connecting the portion of the conductor 48 to have the same potential as the acceleration tube 5, the detection can be carried out based on the same detection principle as described above. Because the whole fiber is made of a fluorescent material, it is expected to have more uniform sensitivity in general compared with the case of coating the surface of the optical fiber with the powdery scintillator.

It should be noted that this embodiment can be used as the backscattered electron detector 9 in the first and second embodiments.

When the observation of the biological specimen was carried out setting the irradiation energy to 3 keV and the probe current to 10 pA to 100 pA using the scanning electron microscope according to this embodiment, the secondary electrons and the backscattered electrons were selectively detected with good results. As described above, this embodiment can provide the low-acceleration scanning electron microscope capable of selectively detecting the backscattered electrons and the secondary electrons despite the low probe current by using the signal electrons included in the medium angle range presenting the high yield. It is also possible to improve the degree of freedom for setting the light guide using the optical fiber.

Fifth Embodiment

Figure 20:
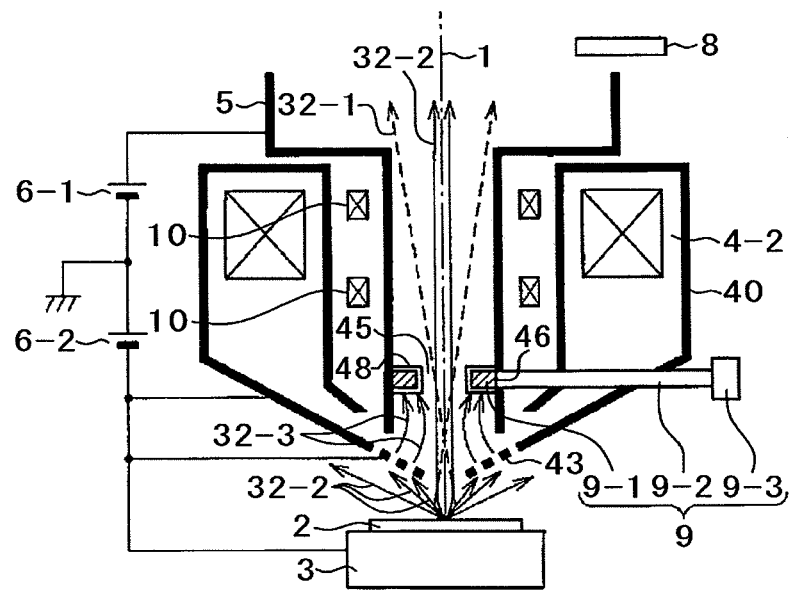
FIG. 20 is a main part schematic cross-sectional view of a scanning electron microscope according to a fifth embodiment.

A fifth embodiment will be explained with reference to FIG. 20. It should be noted that matters described in any of the first to fourth embodiments but not in this embodiment can be applied to this embodiment unless otherwise specified. FIG. 20 is a main part schematic cross-sectional view of a scanning electron microscope according to this embodiment.

This figure shows the components from the specimen holder 3 to the secondary electron detector 8 extracted from the system of the scanning electron microscope constituted by the electron gun 29, the acceleration electrode 28, the condenser lens 27, the aperture 26, the electron lens serving as the objective lens, the acceleration tube 5 for electrons, the deflector 10, the secondary electron detector 8 and the backscattered electron detector 9, the specimen holder 3 on which the specimen 2 is placed, the specimen holder moving mechanism for moving the specimen holder 3 to determine the observation region, the display device for an SEM image, the controller controlling the whole SEM, the vacuum exhaust installation, and the like.

Although the backscattered electron detector 9 installed in the acceleration tube 5 was described as the ET type detector constituted by the scintillator 9-1, the light guide 9-2, and the PMT 9-3 in the third embodiment, as another type of the backscattered electron detector 9, a plate-type detector such as an MCP (micro-channel plate), a solid state detector constituted by a p-n junction or a p-i-n junction, or an avalanche diode detector equipped with an avalanche amplification mechanism may be used. For the detector shape, as shown in FIG. 20, the shape having the passing hole for the electrons in the center of the detector is desirable.

An anode of the detector 9 is electrically connected to the acceleration tube 5 and set to have the same potential as the positive voltage applied to the acceleration tube 5 by the power source 6-1. Such a configuration requires a conversion amplifier to convert the electrons flowing into the anode of the detector 9 into signals. A current signal detected by the anode applied with a high voltage of a few kV is converted into a voltage signal in a in a floating state, and the resulting voltage signal is reduced to the ground potential by an isolation amplifier to be output as the voltage signal. For the connection of such an amplifier, similar circuit configuration will be used regardless of which one of the detectors listed above in this embodiment is used.

By using these detectors, the light guide and the PMT are not required and there is no need of providing the hole for penetration of the magnetic path 40 of the magnetic objective lens any more like the fourth embodiment, which can improve the degree of freedom for setting the detector.

In order to use the detector at the ground potential without using the aforementioned amplifier, the acceleration tube 5 may be set to the ground potential, and the similar retarding field may be created in a retarding state where the conversion electrode 43, the specimen 2, and the specimen holder 3 are applied with 1 kV or higher negative potential by the power source 6-2.

It should be noted that this embodiment can be used as the backscattered electron detector 9 in the first and second embodiments.

When the observation of the biological specimen was carried out setting the irradiation energy to 3 keV and the probe current to 10 pA to 100 pA using the scanning electron microscope according to this embodiment, the secondary electrons and the backscattered electrons were selectively detected with good results.

As described above, this embodiment can provide the low-acceleration scanning electron microscope capable of selectively detecting the backscattered electrons and the secondary electrons despite the low probe current by using the signal electrons included in the medium angle range presenting the high yield. It is also possible to improve the degree of freedom for setting the detector by using the plate-type detector, the solid state detector, or the avalanche diode detector as the backscattered electron detector.

Sixth Embodiment

Figure 21:
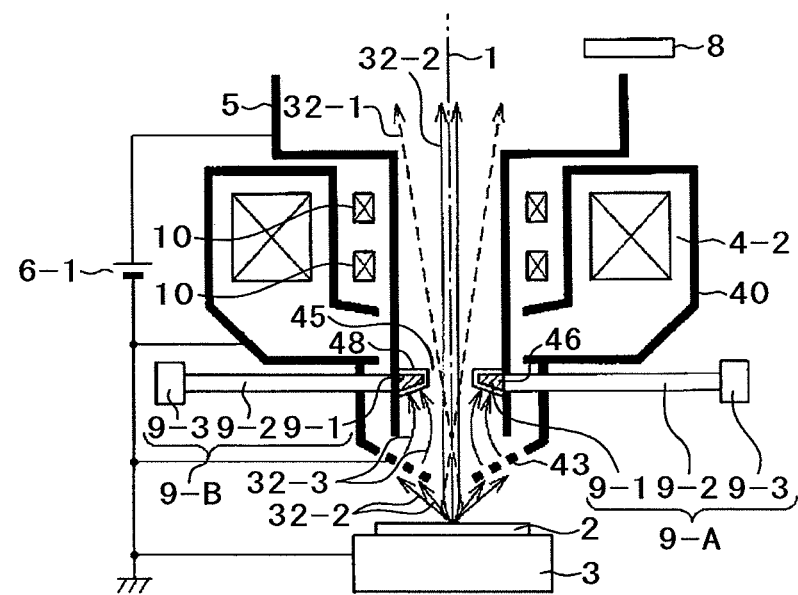
FIG. 21 is a main part schematic cross-sectional view of a scanning electron microscope according to a sixth embodiment.

A sixth embodiment will be explained with reference to FIG. 21. It should be noted that matters described in any of the first to fifth embodiments but not in this embodiment can be applied to this embodiment unless otherwise specified. FIG. 21 shows a main part schematic cross-sectional view of a scanning electron microscope according to this embodiment.

This figure shows the components from the specimen holder 3 to the secondary electron detector 8 extracted from the system of the scanning electron microscope constituted by the electron gun 29, the acceleration electrode 28, the condenser lens 27, the aperture 26, the electron lens serving as the objective lens, the acceleration tube 5 for electrons, the deflector 10, the secondary electron detector 8 and two backscattered electron detectors 9-A and 9-B, the specimen holder 3 on which the specimen 2 is placed, the specimen holder moving mechanism for moving the specimen holder 3 to determine the observation region, the display device for an SEM image, a signal processing system for adding or subtracting output signals of the backscattered electron detectors 9-A and 9-B, the controller controlling the whole SEM, the vacuum exhaust installation, and the like.

It is preferable that the backscattered electron detectors 9-A and 9-B are arranged in the acceleration tube 5 to be line-symmetric with respect to the optical axis 1, and that the scintillator 9-1 has the shape as shown in FIG. 4. As explained in the fourth embodiment, the objective lens is the magnetic lens superimposed by the retarding field 7, which is configured to have the principal plane of the magnetic lens closer to the specimen 2 side lower end of the backscattered electron detector 9 provided in the acceleration tube 5.

In this embodiment, by performing the detection before the conversion electrons 32-3 deriving from the backscattered electrons 32-2 reaches the backscattered electron detectors 9-A and 9-B under the condition of receiving no or little influence by the lens effect of the out-lens type magnetic lens 4-2, rotation of the conversion electrons 32-3 around the optical axis involved in the passage through the magnetic lens is avoided, and the conversion electrons 32-3 are detected while retaining the angular direction of the azimuth angle when the backscattered electrons 32-2 were generated. Thus, by processing the detection signals of the two backscattered electron detectors 9-A, 9-B using a signal processing system (not shown), the detection information deriving from the backscattered electrons 32-2 can be emphasized. That is, assuming an output from the backscattered electron detector 9-A as SA and an output from the backscattered electron detector 9-B as SB, the composition information can be emphasized by an operation signal of $S_A+S_B$, and the roughness information can be emphasized by an operation signal of $S_A-S_B$. In this embodiment, the conversion electrons 32-3 deriving from the backscattered electrons 32-2 are accelerated in the acceleration tube 5 to be detected, and therefore the signal operation is performed while reserving the multiplication of the backscattered electron detector 9. Thus, it is possible to obtain an image emphasizing the composition information and the roughness information with sufficient contrast at the same time.

When the observation of the magnetic specimen was carried out setting the irradiation energy to 3 keV and the probe current to 10 pA to 100 pA using the scanning electron microscope according to this embodiment, the secondary electrons and the backscattered electrons were selectively detected with good results emphasizing the roughness information or the composition information. As described above, this embodiment can provide the low-acceleration scanning electron microscope capable of selectively detecting the backscattered electrons and the secondary electrons despite the low probe current by using the signal electrons included in the medium angle range presenting the high yield. It is also possible to emphasize the detection information deriving from the backscattered electrons by installing two backscattered electron detectors to be in a line-symmetric arrangement with respect to the optical axis and making a configuration having the principal plane of the magnetic lens closer to the electron gun than the specimen side lower end of the backscattered electron detector.

REFERENCE SIGNS LIST

1 Optical axis
2 Specimen
3 Specimen holder
4-1 Semi-in-lens type magnetic lens
4-2 Out-lens type magnetic lens
5 Acceleration tube
6-1 Power source for applying voltage to acceleration tube
6-2 Power source for applying voltage to specimen
7 Retarding field
8 Secondary electron detector
9 Backscattered electron detector
9-1 Scintillator (detector plane) of backscattered electron detector
9-2 Light guide of backscattered electron detector
9-3 Photomultiplier tube (PMT) of backscattered electron detector
9-A Backscattered electron detector A
9-B Backscattered electron detector B
10 Deflector
26 Aperture
27 Condenser lens
28 Acceleration electrode
29 Electron gun
30 Electron optics column
31 Primary electron beam
32 Signal electrons
32-1 Secondary electron
32-2 Backscattered electron
32-3 Conversion electron deriving from backscattered electron
40 Magnetic path of magnetic lens
43 Conversion electrode
44 Conversion plate
45 Passing hole for primary electron beam
46 Light guide connection portion
48 Conductor
49 Light
50 Post for conversion electrode
51 Optical fiber
52 Scintillating fiber
90 Region where conductor is provided on fiber surface

The invention claimed is:

1. A scanning electron microscope comprising:
an electron source generating an electron beam to be used as a probe;
an aperture limiting a diameter of the electron beam;
a specimen holder on which a specimen to be irradiated with the electron beam is placed;
an objective lens for converging the electron beam on a surface of the specimen;
a deflection means for scanning the electron beam on the specimen to be irradiated with the electron beam;
a secondary electron detector detecting secondary electrons from the specimen;
a backscattered electron detector detecting backscattered electrons from the specimen or conversion electrons deriving from the backscattered electrons; and
a cylindrical electron transport means in a position between the electron source and the specimen to be placed on the specimen holder,
wherein a detector plane of the backscattered electron detector is located inside the electron transport means and on a farther side from the electron source than the secondary electron detector and the deflection means, and
the detector plane of the backscattered electron detector is electrically coupled to have the same potential as the electron transport means.

2. The scanning electron microscope according to claim 1, wherein the objective lens includes an electrostatic lens and a magnetic lens, and
the magnetic lens is of a semi-in-lens type.

3. The scanning electron microscope according to claim 1, wherein the objective lens includes an electrostatic lens and a magnetic lens, and
the magnetic lens is of an out-lens type.

4. The scanning electron microscope according to claim 3, further including:
an electrode in a gap between the specimen and the electron transport means to convert the backscattered electrons into the conversion electrons.

5. The scanning electron microscope according to claim 3, wherein there are two of the backscattered electron detectors arranged to be line-symmetric with respect to an optical axis, and
the two backscattered electron detectors are arranged so that the principal plane of the magnetic lens is formed closer to the electron source than a specimen side lower end of the two backscattered electron detectors.

6. The scanning electron microscope according to claim 1, wherein
the backscattered electron detector is a solid state detector, an avalanche diode, or a detector using a scintillator material as a component.

7. The scanning electron microscope according to claim 6, wherein the detector using the scintillator material is an Everhart-Thornley type detector constituted by a scintillator, a light guide, and a photomultiplier tub.

8. The scanning electron microscope according to claim 7, wherein the light guide is an optical fiber.

9. The scanning electron microscope according to claim 7, wherein the light guide and the scintillator are equipped with a scintillator fiber.

10. The scanning electron microscope according to claim 7, wherein the scintillator is provided with a film of a conductor on its surface.

11. The scanning electron microscope according to claim 1, wherein the backscattered electron detector has an opening portion for allowing the secondary electrons to pass therethrough.

12. A scanning electron microscope comprising an electron source, a specimen holder, electron optics including an acceleration tube and an objective lens, accelerating and then retarding electrons emitted from the electron source, and irradiating a specimen placed on the specimen holder with the electrons as an electron beam, a secondary electron detector for detecting secondary electrons from the specimen caused by irradiation of the electron beam, and a backscattered electron detector for detecting backscattered electrons or conversion electrons deriving from the backscattered electrons,
wherein the backscattered electron detector has an opening portion in its central portion with its detector plane being located inside the acceleration tube, and
the detector plane of the backscattered electron detector is electrically coupled to have the same potential as the acceleration tube.

13. The scanning electron microscope according to claim 12, wherein the secondary electron detector detects the secondary electrons having passed through the opening portion of the backscattered electron detector.

14. The scanning electron microscope according to claim 12, wherein the detector plane of the backscattered electron detector is electrically connected to the acceleration tube via a conductor provided to the detector plane.

* * * * *